(12) United States Patent
Yang et al.

(10) Patent No.: US 6,403,420 B1
(45) Date of Patent: Jun. 11, 2002

(54) NITROGEN IMPLANT AFTER BIT-LINE FORMATION FOR ONO FLASH MEMORY DEVICES

(75) Inventors: Jean Yang, Sunnyvale; Yider Wu, San Jose; Mark Ramsbey, Sunnyvale; Yu Sun, Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/627,664

(22) Filed: Jul. 28, 2000

(51) Int. Cl.$^7$ ............................................. H01L 21/336
(52) U.S. Cl. ....................... 438/261; 438/257; 438/264; 438/514
(58) Field of Search ................................ 438/257–261, 438/264, 514

(56) References Cited

U.S. PATENT DOCUMENTS 5,966,603 A * 10/1999 Eitan et al. ................. 438/258
6,130,095 A * 10/2000 Eitan et al. ................. 438/261
6,168,993 B1 * 1/2001 Foote et al. ................. 438/262

* cited by examiner

*Primary Examiner*—Long Pham
(74) *Attorney, Agent, or Firm*—Foley & Lardner

(57) ABSTRACT

A gate structure for an ONO flash memory device includes a first layer of silicon oxide on top of a semiconductor substrate, a second layer of silicon oxide, a layer of silicon nitride sandwiched between the two silicon oxide layers, and a control gate on top of the second layer of silicon oxide. Nitrogen is implanted after the ONO layer and junction areas have been formed. The entire semiconductor structure is heated to anneal out the nitrogen implant damage and to diffuse or drive the implanted nitrogen into the substrate and silicon oxide interface to form strong SiN bonds at that interface. By implanting nitrogen into the ONO stack, instead of a single silicon oxide layer as done conventionally, damage to the underlying silicon substrate is reduced. This results in better isolation between adjacent bit lines and suppresses leakages between adjacent bit lines.

16 Claims, 4 Drawing Sheets

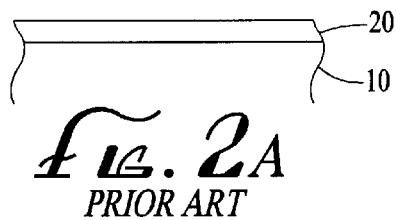
FIG. 2A
PRIOR ART
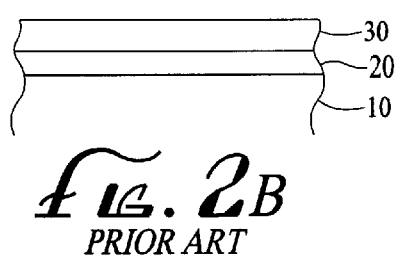
FIG. 2B
PRIOR ART
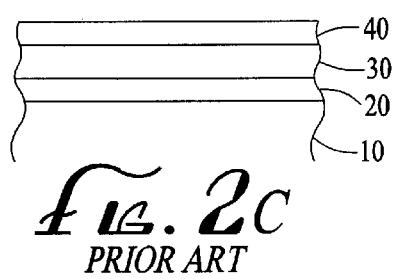
FIG. 2C
PRIOR ART
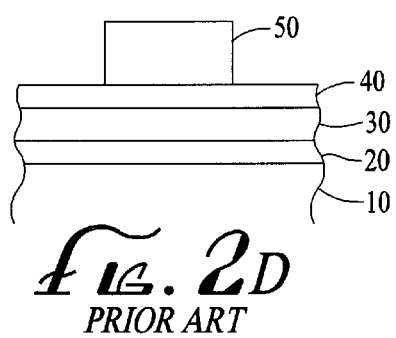
FIG. 2D
PRIOR ART
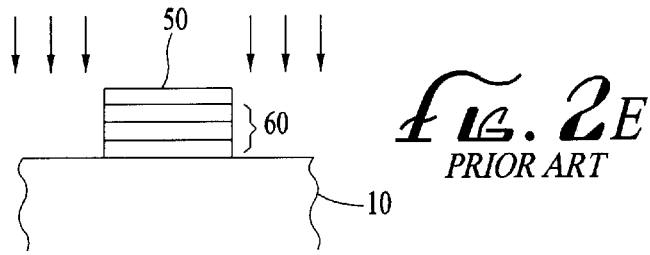
FIG. 2E
PRIOR ART
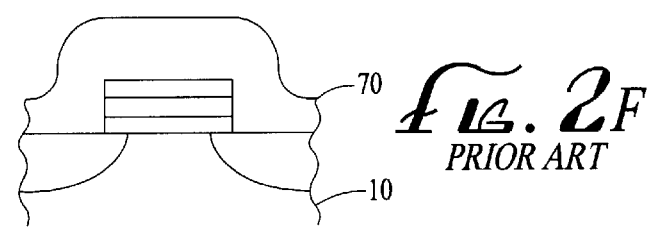
FIG. 2F
PRIOR ART
FIG. 2G
PRIOR ART
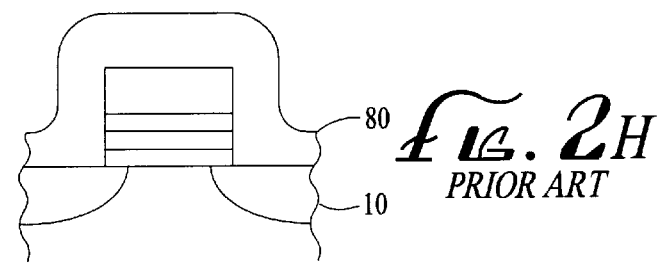
FIG. 2H
PRIOR ART
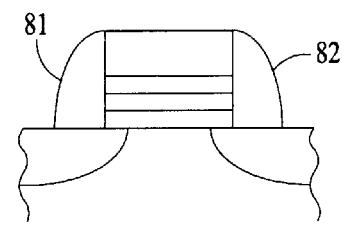
FIG. 2I
PRIOR ART

NITROGEN IMPLANT AFTER BIT-LINE FORMATION FOR ONO FLASH MEMORY DEVICES

BACKGROUND OF THE INVENTION

1. Field of the Invention

The invention relates generally to flash memory devices and more particularly to a method of fabricating flash memory devices having an ONO layer which contains a silicon nitride layer sandwiched between two silicon oxide layers.

2. Description of the Related Art

A flash memory having an ONO layer is illustrated in FIG. 1. It includes an ONO layer 60 disposed on top of a silicon substrate 10, and a control gate 71, typically of polysilicon, disposed on top of the ONO layer 60. The ONO layer 60 comprises a lower layer 61 made of silicon oxide, a middle layer 62 made of silicon nitride, and an upper layer 63 made of silicon oxide.

FIGS. 2A–2I illustrate the conventional process for fabricating a flash memory device having an ONO layer. First, a silicon oxide layer 20 is thermally grown on the silicon substrate 10 to form the structure of FIG. 2A. Then, as shown in FIG. 2B, nitrogen atoms (N or $N_2$) are implanted into the silicon oxide layer 20.

The nitrogen implanting step is followed by heating to anneal out the implant damage and to diffuse the implanted nitrogen to the $Si/SiO_2$ interface 21 and cause SiN bonds to be formed at the $Si/SiO_2$ interface 21. The heating is performed in a furnace and the entire heating process takes several hours because the process requires a long time to ramp up and ramp down.

Subsequently, a silicon nitride layer 30 is deposited on top of the silicon oxide layer 20 by chemical vapor deposition (CVD). FIG. 2C shows the silicon nitride layer 30 deposited on top of the silicon oxide layer 20. A second layer of silicon oxide 40 is then formed on top of the silicon nitride layer 30 and the resulting structure is shown in FIG. 2D. Thereafter, as shown in FIG. 2E, a photoresist 50 is formed on top of the second silicon oxide layer 40, and this semiconductor structure is etched until an upper surface of the silicon substrate 10 is exposed. The resulting structure, shown in FIG. 2F, is subsequently implanted with arsenic and boron ions using the remaining photoresist 50 as a mask and heated to diffuse the implanted ions.

The remaining photoresist 50 is stripped away and, as shown in FIG. 2G, a polysilicon layer 70 is deposited on top of the exposed surface of the silicon substrate 10 and on top and sidewalls of the ONO layer 60. The polysilicon layer 70 is then patterned using conventional lithography techniques and a control gate 71 remains on top of the ONO layer 60. FIG. 2H shows the resulting gate structure 75 including the control gate 71 and the ONO layer 60.

Oxide spacers 81, 82, shown in FIG. 2I, are formed on the sidewalls of the gate structure 75 by (i) depositing a conformal layer of silicon oxide 80 by CVD on the exposed surface of the silicon substrate 10 and on top and sidewalls of the gate structure 75 (FIG. 2I), and (ii) anisotropically etching the deposited silicon oxide.

SUMMARY OF THE INVENTION

The invention provides a process for forming an ONO flash memory device that improves the $Si/SiO_2$ interface robustness against hot carrier degradation by carrying out the step of nitrogen implantation after bit-line formation.

The invention produces a gate structure for an ONO flash memory device that includes a first layer of silicon oxide on top of a semiconductor substrate, a second layer of silicon oxide, a layer of silicon nitride sandwiched between the two silicon oxide layers, and a control gate on top of the second layer of silicon oxide.

In the process according to the invention, the ONO layer is first formed and patterned, and junction areas are formed in the substrate. Thereafter, nitrogen is implanted into the patterned ONO layer and the entire semiconductor structure is heated to anneal out the nitrogen implant damage and to diffuse or drive the implanted nitrogen into the substrate and silicon oxide interface to form strong SiN bonds at that interface. The SiN bonds is desirable because they improve the bonding strength at the interface and the nitrogen remaining in the silicon oxide layer increases the oxide bulk reliability.

By implanting nitrogen into the ONO stack, instead of a single silicon oxide layer, damage to the underlying silicon substrate is reduced.- If the nitrogen was implanted into only the single silicon oxide layer, the damage to the underlying silicon substrate would be larger. This results in better isolation between adjacent bit lines and suppresses leakages between adjacent bit lines.

Additional objects, features and advantages of the invention will be set forth in the description of preferred embodiments which follows.

BRIEF DESCRIPTION OF THE DRAWINGS

The invention is described in detail herein with reference to the drawings in which:

FIGS. 2A–2I illustrate the conventional process for forming a flash memory device having an ONO layer.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

Figure 1:
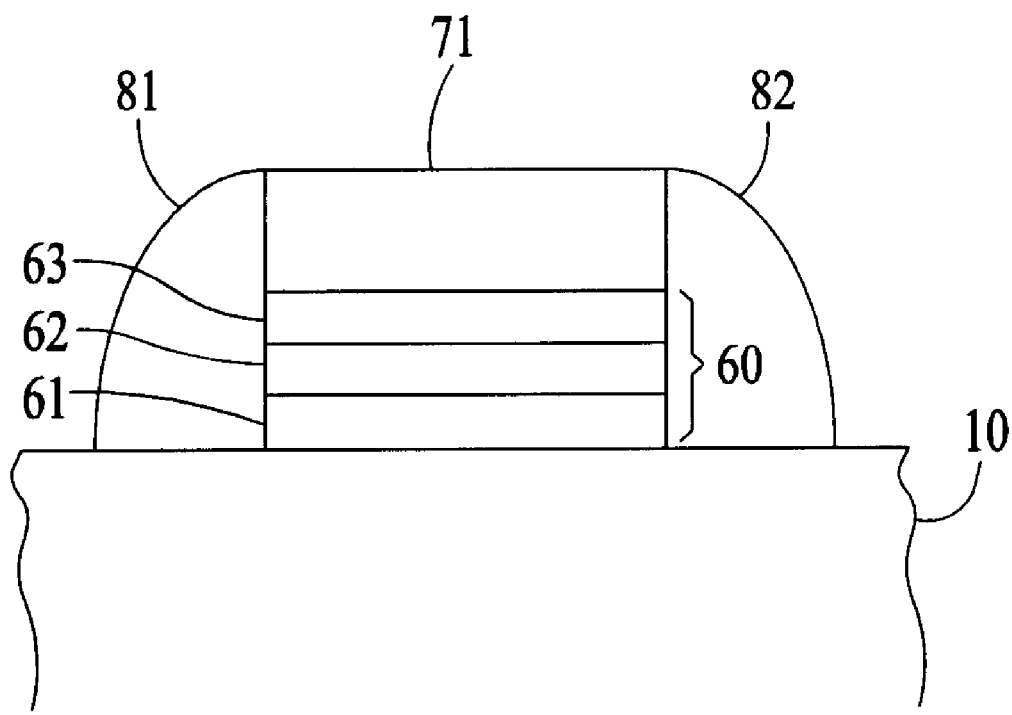
FIG. 1 illustrates in a cross section a flash memory device having an ONO layer.
Figure 3A:
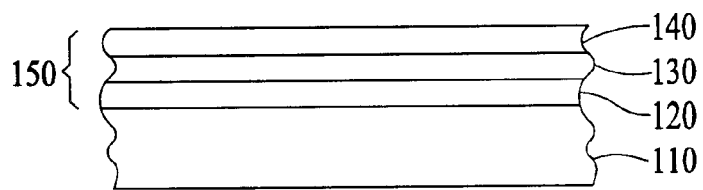
FIGS. 3A–3G illustrate the process according to an embodiment of the invention for forming a flash memory device having an ONO layer.

FIGS. 3A–3G illustrate the process according to an embodiment of the invention for fabricating a flash memory device having an ONO layer. First, as shown in FIG. 3A, an ONO layer 150 is formed on top of a semiconductor substrate 110. The lower layer of silicon oxide 120 is thermally grown on the silicon substrate 110 to a thickness of about 50–150 Å by heating the semiconductor substrate 110. Subsequently, a silicon nitride layer 130 is deposited on top of the silicon oxide layer 120 by chemical vapor deposition (CVD) to a thickness of about 50–80 Å. An upper layer of silicon oxide 140 is then formed on top of the silicon nitride layer 130 and the resulting structure is shown in FIG. 3A.

Figure 3B:
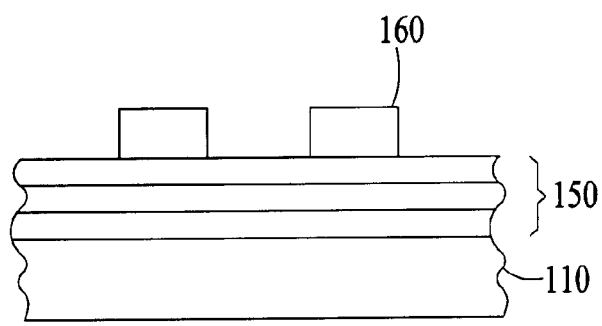
Figure 3C:
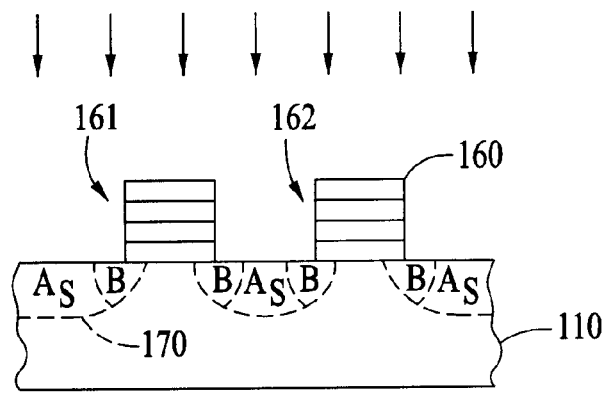

Thereafter, as shown in FIG. 3B, a photoresist 160 is formed on top of the ONO layer 150. The structure of FIG. 3B is then etched until ONO stacks 161, 162 are formed and an upper surface of the silicon substrate 110 is exposed. The resulting structure, shown in FIG. 3C, is subsequently implanted with arsenic and boron ions using the remaining photoresist 160 as a mask and heated to diffuse the implanted ions and form the junctions 170.

Figure 3D:
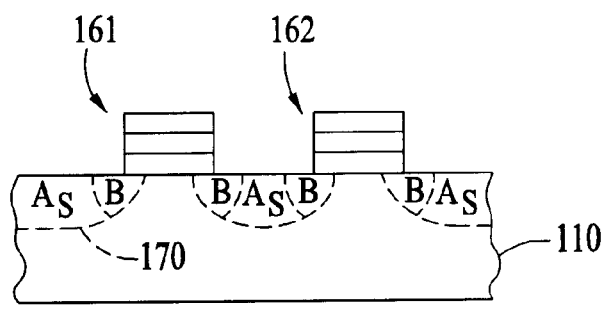

The remaining photoresist 160 is then stripped and the resulting semiconductor structure, shown in FIG. 3D, is heated in an oxygen atmosphere at a temperature of about 800° C. for about 20 minutes. As a result, a silicon oxide layer 180 is formed above the junctions 170, as shown in FIG. 3E.

Figure 3E:
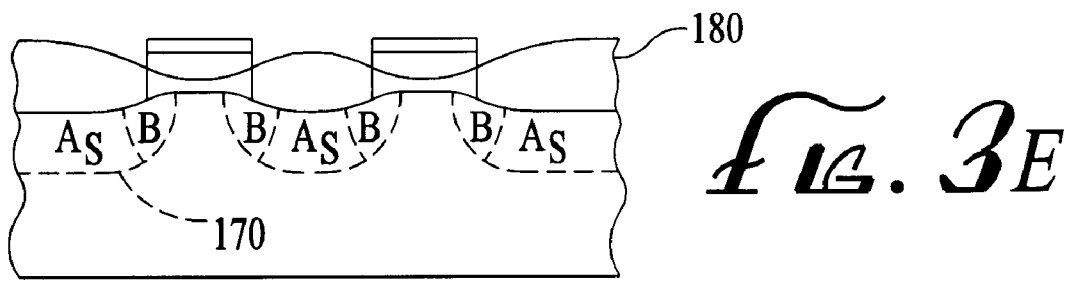
Figure 3F:
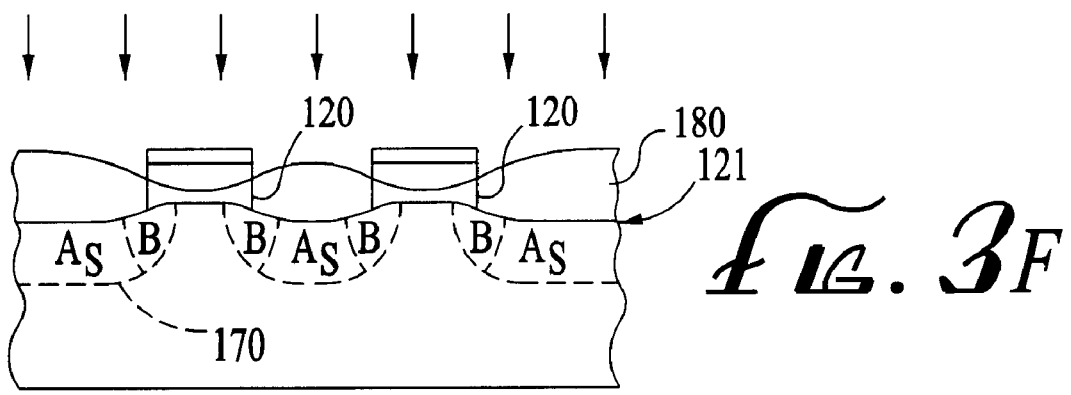
Figure 3G:
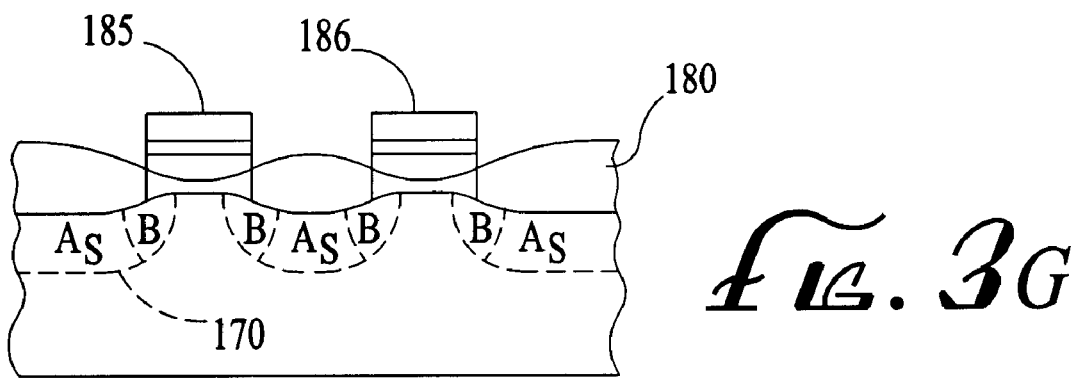

The structure of FIG. 3E is then implanted with nitrogen atoms (N or $N_2$) at energy levels of about 5–15 keV and annealed in an nitrogen atmosphere at a temperature of 800–1100° C. for about 20 minutes. This step anneals out the implant damage and diffuses the implanted nitrogen to the Si/$SiO_2$ interface 121 to cause SiN bonds to be formed at the Si/$SiO_2$ interface 121 and towards the junction edge (i.e., toward locations indicated as "B" in the junctions 170). The SiN bonds is desirable because they improve the bonding strength at the Si/$SiO_2$ interface 121 of the resulting flash memory device. Further, some nitrogen remaining in the silicon oxide layer 120 increases the oxide bulk reliability, and protects the silicon oxide layer 120 against time-dependent dielectric breakdown. Subsequently, as shown in FIG. 3G, polysilicon control gates 185, 186 are formed respectively on top of the ONO stacks 161, 162.

While particular embodiments according to the invention have been illustrated and described above, it will be clear that the invention can take a variety of forms and embodiments within the scope of the appended claims.

We claim:

1. In a flash memory device having a silicon substrate and an ONO layer above the silicon substrate, the ONO layer including an upper layer of silicon oxide, a middle layer of silicon nitride, and a lower layer of silicon oxide, a method of forming silicon nitride bonds at an interface between the lower layer and the silicon substrate, said method comprising the steps of:

forming the ONO layer on top of the semiconductor substrate;

patterning the ONO layer;

implanting ions into portions of the silicon substrate not covered by the ONO layer;

thermally growing an oxide layer above the portions of the silicon substrate not covered by the ONO layer;

implanting nitrogen through the ONO layer and the thermally grown oxide layer; and annealing the semiconductor substrate.

2. The method according to claim 1, wherein the step of annealing is performed at a temperature of 800–1100° C.

3. The method according to claim 1, wherein the step of annealing is performed at a temperature of 800–1100° C. for about 0.5 to 20 minutes.

4. The method according to claim 3, wherein the step of annealing is performed in an atmosphere containing an inert gas.

5. The method according to claim 4, wherein the step of annealing is performed in an atmosphere containing nitrogen.

6. The method according to claim 4, wherein the step of annealing is performed in an atmosphere containing argon.

7. The method according to claim 1, wherein the step of thermally growing includes the step of heating in at a temperature of about 800° C. for about 20 minutes in an atmosphere containing oxygen.

8. The method according to claim 1, wherein the step of implanting nitrogen is carried out at energy levels of 5 keV to 15 keV.

9. A method of forming a gate structure for a flash memory device on top of a semiconductor substrate, comprising the steps of:

forming the ONO layer on top of the semiconductor substrate;

forming a photoresist mask on top of the ONO layer;

etching the ONO layer until surfaces of the silicon substrate not covered by the ONO layer are exposed;

implanting ions into the exposed surfaces of the silicon substrate;

removing the photoresist mask remaining after the step of etching;

thermally growing an oxide layer above the portions of the silicon substrate not covered by the ONO layer;

implanting nitrogen through the ONO layer and the thermally grown oxide layer;

annealing the semiconductor substrate; and forming a control gate on top of the ONO structure.

10. The method according to claim 9, wherein the step of annealing is performed at a temperature of 800–1100° C.

11. The method according to claim 9, wherein the step of annealing is performed at a temperature of 800–1100° C. for about 0.5 to 20 minutes.

12. The method according to claim 11, wherein the step of annealing is performed in an atmosphere containing an inert gas.

13. The method according to claim 12, wherein the step of annealing is performed in an atmosphere containing nitrogen.

14. The method according to claim 12, wherein the step of annealing is performed in an atmosphere containing argon.

15. The method according to claim 9, wherein the step of thermally growing includes the step of heating in at a temperature of about 800° C. for about 20 minutes in an atmosphere containing oxygen.

16. The method according to claim 9, wherein the step of implanting nitrogen is carried out at energy levels of 5 keV to 15 keV.

* * * * *